United States Patent [19]
Chi et al.

[11] Patent Number: 5,543,350
[45] Date of Patent: Aug. 6, 1996

[54] SRAM RESISTOR TAB DOPING BY PLUG IMPLANT FROM BURIED CONTACT

[75] Inventors: Keh-Fei C. Chi, Singapore; Seah K. Suan; Ling H. Yow, both of Singapore Science Park, all of Singapore

[73] Assignee: Chartered Semiconductor Manufacturing Pte Ltd, Singapore, Singapore

[21] Appl. No.: 536,857

[22] Filed: Sep. 29, 1995

[51] Int. Cl.$^6$ ............................. H01L 21/70; H01L 27/00
[52] U.S. Cl. ................. 437/60; 437/52; 437/918
[58] Field of Search ...................... 437/47–48, 52, 437/60, 195, 918, 200, 203; 148/DIG. 136; 257/903–904

[56] References Cited

U.S. PATENT DOCUMENTS

| | | | |
|---|---|---|---|
| 4,916,507 | 4/1990 | Boudou et al. | 437/60 |
| 5,346,836 | 9/1994 | Manning et al. | 437/52 |
| 5,462,894 | 10/1995 | Spinner et al. | 437/60 |

*Primary Examiner*—H. Jey Tsai
*Attorney, Agent, or Firm*—George O. Saile; Rosemary L. S. Pike

[57] ABSTRACT

A new method of forming a back diffused resistive load element is achieved. A pattern of gate electrodes and interconnection lines is formed overlying a semiconductor substrate. Source and drain regions are formed within the semiconductor substrate. An interpoly oxide layer is deposited overlying the top surfaces of the semiconductor substrate and etched away where it is not covered by a mask to provide an opening to a drain region within the semiconductor substrate and exposing a portion of a gate electrode wherein a spacer comprising interpoly oxide is left on the sidewall of the exposed gate electrode within the opening. In order to remove the interpoly oxide spacer, the interpoly oxide layer is overetched whereby the top portion of the drain region in the semiconductor substrate is etched away along with a portion of the dopant. First ions are implanted into the drain region and the exposed portion of the gate electrode. A third layer of undoped polysilicon is deposited over the surface of the interpoly oxide and within the opening and patterned. During subsequent processing, the first ions implanted into the drain region and the exposed portion of the gate electrode diffuse into the third layer of polysilicon and into the substrate increasing the drain junction depth. The third polysilicon layer forms the resistive load element. Second ions are implanted into the third polysilicon layer to define a resistor value.

42 Claims, 4 Drawing Sheets

5,543,350

SRAM RESISTOR TAB DOPING BY PLUG IMPLANT FROM BURIED CONTACT

BACKGROUND OF THE INVENTION

(1) Field of the Invention

The invention relates to the fabrication of integrated circuit devices, and more particularly, to a method of forming a resistive load element in the fabrication of integrated circuits.

(2) Description of the Prior Art

In integrated circuit fabrication, some integrated circuits, such as a static random access memory (SRAM), require a resistive load. A resistive load element can be fabricated using a lightly doped polysilicon with both ends connected to other circuitry through a contact. The other circuitry could be metal or polysilicon interconnect or N+ diffusion line characteristic of low resistance. The lightly doped polysilicon with high resistance serves as a resistor. Its resistance is determined by its doping concentration as well as its dimension. In a typical SRAM cell, the resistor load needs to make simultaneous contact to the gate electrode and to the drain (N+) of the pull-down transistor as well as to the metal line to pass gate transistor. A resistor tab making contact with a gate and a drain region needs sufficient dopant at the interface to ensure an ohmic contact. However, when a contact opening is etched to the drain region in the semiconductor substrate, a large amount of dopant at the surface of the drain region is removed. The majority of the dopant is at the surface because the etch is performed before the dopant has been driven in by a high temperature step. In a conventional process, the resistor is lightly doped to define resistor value, then tabs on either side of the resistor are opened up in a mask for a high dose implant. The mask defines the resistor length.

U.S. Pat. Nos. 5,348,901 to Chen et al and 5,196,233 to Chan et al describe methods of forming resistive load elements.

SUMMARY OF THE INVENTION

A principal object of the present invention is to provide an effective and very manufacturable method of forming a resistive load element in the fabrication of an integrated circuit.

Another object of the present invention is to provide a method of ensuring a high doping level at the interface of a resistive load element with a gate and drain region in the fabrication of an integrated circuit.

Yet another object of the invention is to provide a method of forming a resistive load element in which a tab implant is not required.

A further object is to provide a method of back diffusion to ensure a high doping level at the interface of a resistive load element with a gate and drain region in the fabrication of an integrated circuit.

In accordance with the objects of this invention a new method of forming a back diffused resistive load element is achieved. A first doped polysilicon layer is provided overlying a gate silicon oxide layer. A layer of tungsten silicide is deposited overlying the first doped polysilicon layer. A second undoped layer of polysilicon is deposited overlying the tungsten silicide layer. The second polysilicon, tungsten silicide, first polysilicon and gate silicon oxide layers are etched away where they are not covered by a mask to form gate electrodes and interconnection lines. Source and drain regions are formed within the semiconductor substrate. An interpoly oxide layer is deposited overlying the top surfaces of the semiconductor substrate. The interpoly oxide is etched away where it is not covered by a mask to provide an opening to (1) a polysilicon interconnect line and (2) a drain region within the semiconductor substrate and exposing a portion of the gate electrode wherein a spacer comprising interpoly oxide is left on the sidewall of the exposed gate electrode within the opening. In other to remove the interpoly oxide spacer, the interpoly oxide layer is overetched whereby the top portion of the drain region in the semiconductor substrate is etched away along with a portion of the dopant. First ions are implanted into the drain region and the exposed portion of the gate electrode. A third layer of undoped polysilicon is deposited over the surface of the interpoly oxide and within the openings and patterned. During subsequent processing, the first ions implanted into the drain region and the exposed portion of the gate electrode diffuse into the third layer of polysilicon and into the substrate increasing the drain junction depth. The third polysilicon layer forms the resistive load element. Second ions are implanted into the third polysilicon layer to define a resistor value. An insulating layer is deposited overlying the interpoly oxide and the third polysilicon layers. An opening is etched through the insulating layer and the interpoly oxide to the gate polysilicon layer. A conducting layer is deposited overlying the insulating layer and within the opening and patterned to complete the formation of the resistive load element in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
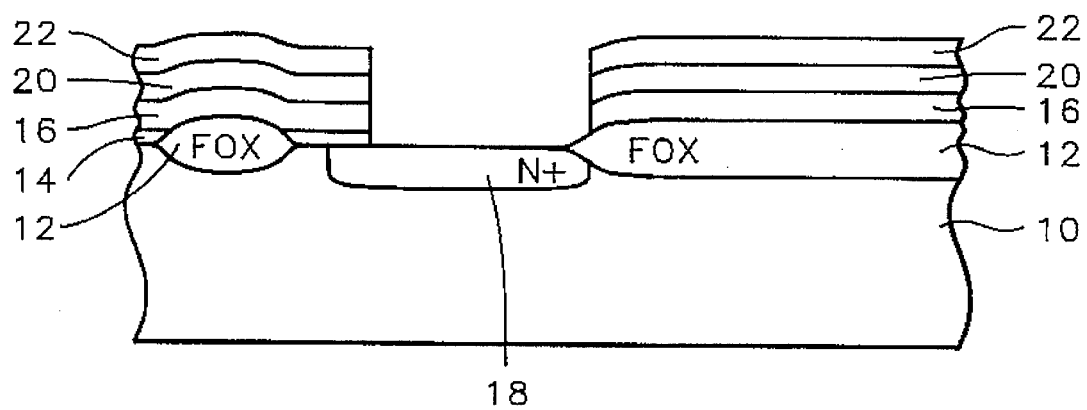
FIGS. 1 through 6 schematically illustrate in cross-sectional representation a preferred embodiment of the process of the present invention.

Referring now more particularly to FIG. 1, there is shown a portion of a partially completed integrated circuit. There is shown a monocrystalline semiconductor substrate 10 in which there are formed field oxide regions 12. A gate oxide layer 14 is grown on the surface of the semiconductor substrate, typically to a thickness of between about 60 to 150 Angstroms.

The polysilicon layer 16 is blanket deposited by low pressure chemical vapor deposition (LPCVD) at a temperature of between about 500° to 700° C. to a thickness of between about 1000 to 3000 Angstroms, and preferably 1500 to 2500 Angstroms. The polysilicon layer is doped with phosphorus ions at a dosage of between about 3E15 to 1E16 atoms/cm$^2$ or is doped with a POCl$_3$ source at between about 800° to 900° C.

Next, a layer of tungsten silicide 20 is deposited overlying the polysilicon layer 16 to a thickness of between about 1000 to 3000 Angstroms. The tungsten silicide has a lower resistivity than the polysilicon. It is used to reduce interconnection resistance. Next, an undoped polysilicon layer 22 is deposited overlying the tungsten silicide layer 20 to a thickness of between about 400 to 800 Angstroms. This top polysilicon layer is used to supply silicon to the tungsten silicide layer during later oxidation to avoid depletion of silicon. Depletion of silicon causes a metal-rich film which tends to have high stress and peeling.

The layers 14, 16, 20, and 22 are etched away where not covered by a mask to leave polysilicon gate electrodes and interconnection lines, as shown in FIG. 1. Source/drain N+ regions 18 are formed by arsenic ion implant with a dosage of between about 1E15 to 5E15 atoms/cm$^2$ and energy of between about 30 to 80 KeV. P+ regions, not shown, are used for periphery transistors and are formed similarly by implanting $BF_2$ ions at a dosage of between about 1E15 to 3E15 atoms/cm$^2$ and energy of between about 30 to 60 KeV.

Figure 2:
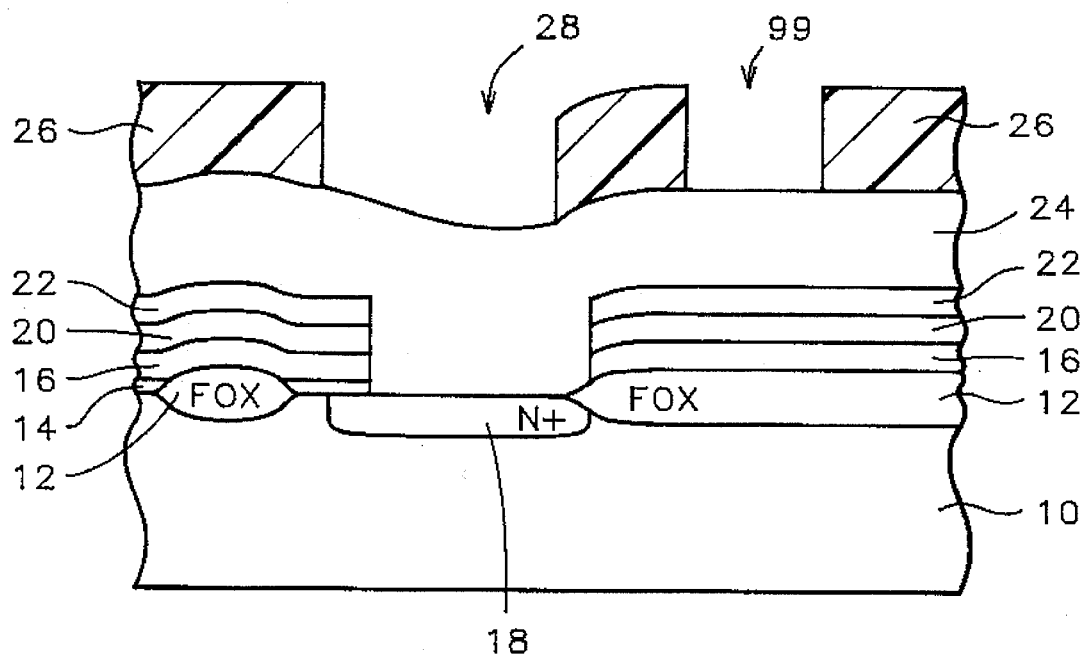
Figure 3:
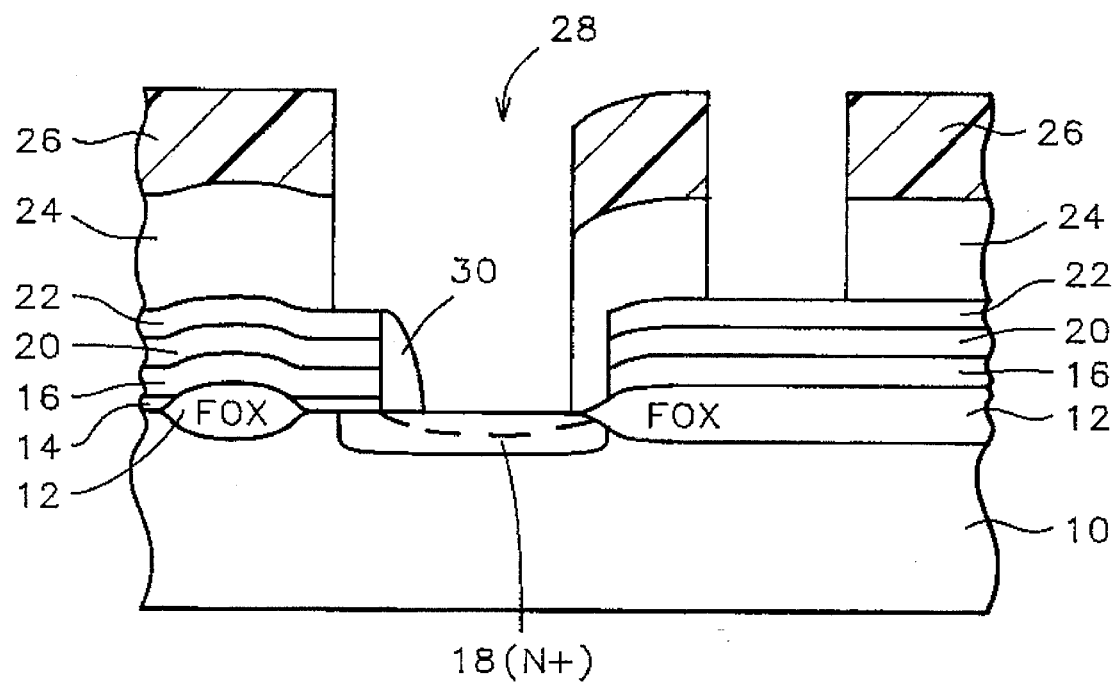

Referring now to FIG. 2, a layer of interpoly oxide 24 is deposited over the gate electrodes and interconnection lines and over the surface of the substrate to a thickness of between about 1200 to 2500 Angstroms. A layer of photoresist 26 is coated over the surface of the substrate and patterned to form a mask leaving an opening 28 where contact will be made to the N+ drain region 18 and the other opening 99 which will connect the load resistor to the poly interconnect line. The interpoly oxide layer 24 is etched away with an etch stop at the silicon substrate at the N+ region 18. This leaves an interpoly oxide spacer 30 on the sidewall of the gate. An overetch is performed to dotted line 32 to remove the spacer 30. A portion of the N+ region 18 is removed during this overetching. Since a high temperature drive-in step has not been performed, most of the dopant in the N+ region is in the top portion that is removed during the overetch. This will cause high resistance from the gate electrode to the N+ region. A third polysilicon film is to be formed within the opening 28 to connect the gate electrode and N+ drain region 18. In order to ensure sufficient dopant at the interface, a high dosage implant into the drain region 18 is now performed.

Figure 4:
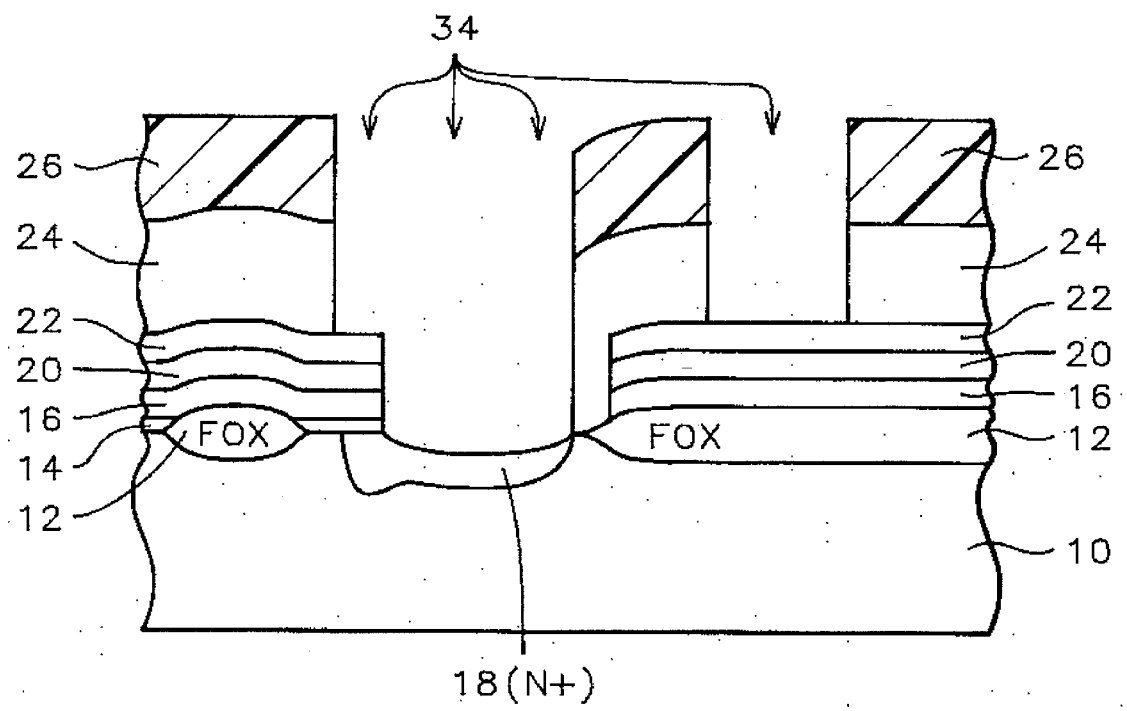

Referring now to FIG. 4, a high dosage implant 34 of phosphorus or arsenic ions is performed with a dosage of between about 5 E 15 to 1 E 16 atoms/cm$^2$ at a energy of between about 50 to 80 KeV. The photoresist layer 26 is removed.

Figure 5:
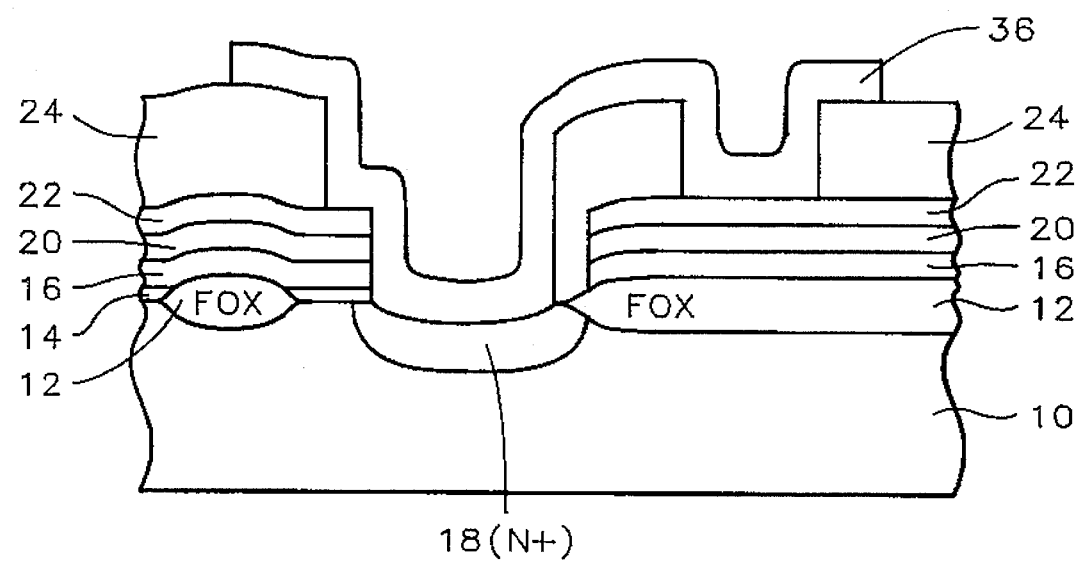

Referring now to FIG. 5, a third polysilicon layer 36 is deposited by LPCVD over the surfaces of the semiconductor substrate to a thickness of between about 400 to 1000 Angstroms. This polysilicon layer 36 is lightly doped with a very light dose of boron or phosphorus to stabilize its resistivity to the desirable range. The polysilicon resistor 36 is patterned and etched as shown in FIG. 5.

To define the resistor value, phosphorus or boron ions are implanted into the polysilicon layer 36 at a dosage of between about 1 E 13 to 3 E 14 atoms/cm$^2$ and an energy of between about 30 to 60 KeV. The resistor value is between about 1 to 500 gigaohm, depending upon the product.

Figure 6:
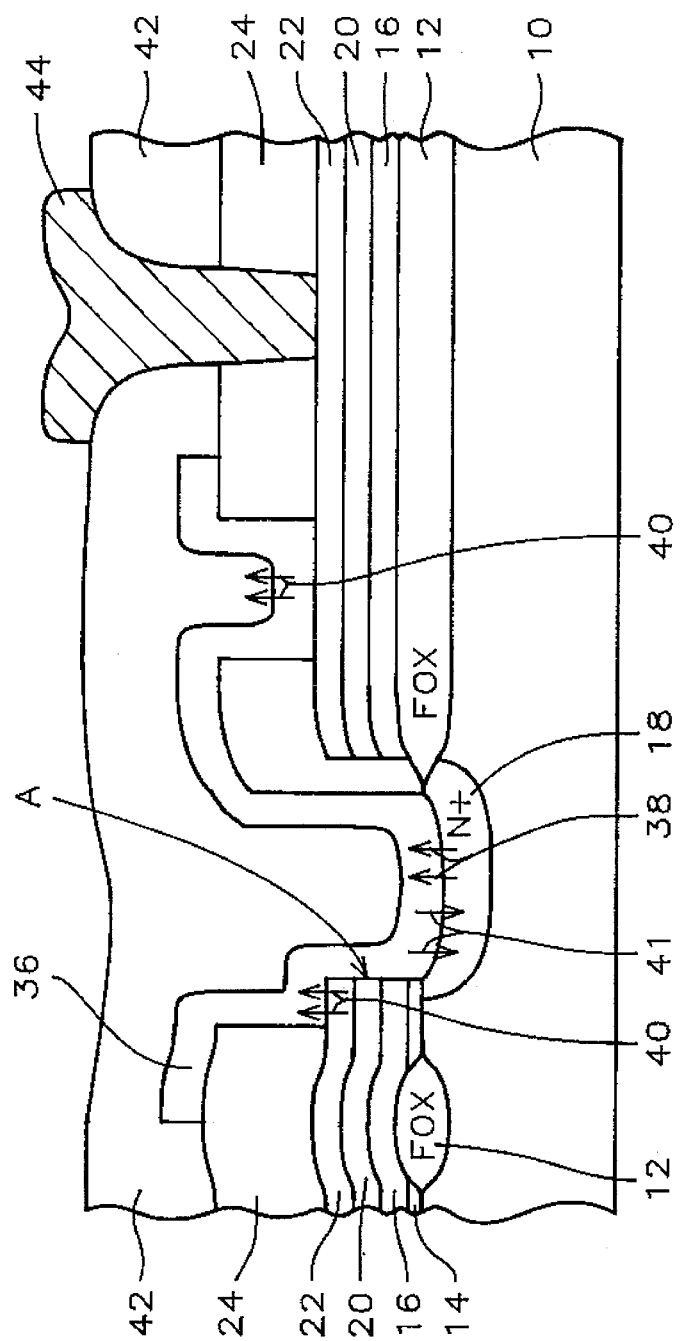

Next, an insulating layer 42, such as borophosphosilicate glass (BPSG) and tetraethoxysilane (TEOS) or the like, is deposited over the surface of the substrate to a thickness of between about 5000 to 10,000 Angstroms, as illustrated in FIG. 6.

During subsequent processing at a temperature over about 850°–900° C., such as during BPSG/TEOS densification, the dopant back diffuses from the N+ region, illustrated by arrows 38, and from the top polysilicon layer 22 of the gate electrode, illustrated by arrows 40, into the polysilicon layer 36. Also, some of the dopant within the N+ region 18 is driven in to the substrate, illustrated by arrows 41, to complete formation of the drain region 18 with a junction depth of between about 1500 to 2500 Angstroms.

A via opening is etched through the insulating layer 42 interpoly oxide 24 to the gate polysilicon layer (22, 20 and 16) where contact is to be made. Metal layer 44, such as tungsten or aluminum, is deposited over the surface of the insulating layer 42 and within the via opening and then patterned to complete the connection.

Figure 7:
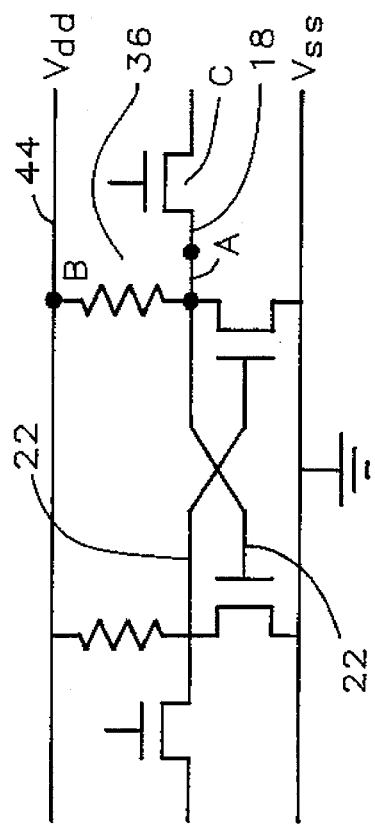
FIG. 7 illustrates a circuit diagram of a completed SRAM fabricated according to the process of the present invention.

FIG. 7 is a circuit diagram of the completed integrated circuit illustrated in FIG. 6. The resistor 36 is shown connecting to the metal line 44. A is the critical connection of the present invention between the gate electrode 22, the N+ region 18, of the pass gate transistor C, and the load resistor 36.

The process of the invention results in an integrated circuit having a resistive load element having a butting contact between the resistor, the gate electrode and the drain region. Sufficient dopant concentration at the interface ensures an ohmic contact. This sufficient dopant concentration can be obtained without the tab implant and additional tab implant mask of the traditional process. The possibility of lateral diffusion of the dopant is reduced in the process of the invention.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing a layer of gate silicon oxide over a surface of a semiconductor substrate;

providing a first doped polysilicon layer overlying said gate silicon oxide layer;

depositing a layer of tungsten silicide overlying said first doped polysilicon layer;

depositing a second undoped layer of polysilicon overlying said tungsten silicide layer;

etching away said second undoped polysilicon, said tungsten silicide, said first doped polysilicon and said gate silicon oxide layers where they are not covered by a mask to form a gate electrode;

implanting first ions into said semiconductor substrate to form source and drain regions;

depositing an interpoly oxide layer overlying the surface of said semiconductor substrate;

etching away said interpoly oxide where it is not covered by a mask to provide an opening to said drain region within said semiconductor substrate and exposing a portion of said gate electrode wherein a spacer comprising interpoly oxide is left on a sidewall of said exposed portion of said gate electrode within said opening to said drain region;

overetching said interpoly oxide layer to remove said interpoly oxide spacer whereby a top portion of said drain region within said semiconductor substrate and a portion of said first ions are etched away;

implanting second ions into said etched drain region and said exposed portion of said gate electrode;

depositing a third layer of undoped polysilicon over a surface of said interpoly oxide and within said opening to said drain region and patterning said third undoped polysilicon layer wherein said third undoped polysilicon layer forms a resistive load element and wherein during subsequent processing said second ions implanted into said drain region and said exposed portion of said gate electrode diffuse into said third layer of undoped polysilicon and diffuse into said semiconductor substrate underlying said drain region to increase a junction depth of said drain region;

doping said patterned third undoped polysilicon layer to define a resistor value;

depositing an insulating layer overlying said interpoly oxide and said third undoped polysilicon layers;

etching an opening through said insulating layer to said second undoped polysilicon layer; and depositing a conducting layer overlying said insulating layer and within said opening through said insulating layer and patterning said conducting layer completing the fabrication of said integrated circuit device.

2. The method according to claim 1 wherein said first doped polysilicon layer has a thickness of between about 1000 to 3000 Angstroms.

3. The method according to claim 1 wherein said first doped polysilicon layer is doped by diffusion of $POCl_3$.

4. The method according to claim 1 wherein said first doped polysilicon layer is doped by ion implant of phosphorus ions with a dosage of between about 3 E 15 to 1 E 16 atoms/$cm^2$.

5. The method according to claim 1 wherein said tungsten silicide layer is deposited to a thickness of between about 1000 to 3000 Angstroms.

6. The method according to claim 1 wherein said second undoped polysilicon layer is deposited to a thickness of between about 400 to 800 Angstroms.

7. The method according to claim 1 wherein said first ions are arsenic ions implanted at a dosage of between about 1 E 15 to 5 E 15 atoms/$cm^2$ and an energy of between about 30 to 80 KeV.

8. The method according to claim 1 wherein said first ions are $BF_2$ ions implanted at a dosage of between about 1 E 15 to 5 E 15 atoms/$cm^2$ and an energy of between about 30 to 60 KeV.

9. The method according to claim 1 wherein said interpoly oxide layer is deposited to a thickness of between about 1200 to 2500 Angstroms.

10. The method according to claim 1 wherein said third undoped polysilicon layer is deposited to a thickness of between about 400 to 1000 Angstroms.

11. The method according to claim 1 wherein said second ions are arsenic ions implanted with a dosage of between about 5 E 15 to 1 E 16 atoms/$cm^2$ and an energy of between about 50 to 80 KeV.

12. The method according to claim 1 wherein said second ions are phosphorus ions implanted with a dosage of between about 5 E 15 to 1 E 16 atoms/$cm^2$ and an energy of between about 50 to 80 KeV.

13. The method according to claim 1 wherein said junction depth of said drain region is between about 1500 to 2500 Angstroms.

14. The method according to claim 1 wherein said third undoped polysilicon layer is doped with phosphorus ions implanted with a dosage of between about 1 E 13 to 3 E 14 atoms/$cm^2$ and an energy of between about 30 to 60 KeV.

15. The method according to claim 1 wherein said third undoped polysilicon layer is doped with boron ions implanted with a dosage of between about 1 E 13 to 3 E 14 atoms/$cm^2$ and an energy of between about 30 to 60 KeV.

16. The method according to claim 1 wherein said conducting layer is aluminum.

17. The method according to claim 1 wherein said conducting layer is tungsten.

18. A method of forming a resistive load element in a fabrication of an integrated circuit comprising:

providing a layer of gate silicon oxide over a surface of a semiconductor substrate;

providing a first doped polysilicon layer overlying said gate silicon oxide layer;

depositing a layer of tungsten silicide overlying said first doped polysilicon layer;

depositing a second undoped layer of polysilicon overlying said tungsten silicide layer;

etching away said second undoped polysilicon, said tungsten silicide, said first doped polysilicon and said gate silicon oxide layers where they are not covered by a mask to form a gate electrode;

implanting first ions into said semiconductor substrate to form source and drain regions;

depositing an interpoly oxide layer overlying the surface of said semiconductor substrate;

etching away said interpoly oxide where it is not covered by a mask to provide an opening to said drain region within said semiconductor substrate and exposing a portion of said gate electrode wherein a spacer comprising interpoly oxide is left on a sidewall of said exposed portion of said gate electrode within said opening to said drain region;

overetching said interpoly oxide layer to remove said interpoly oxide spacer whereby a top portion of said drain region within said semiconductor substrate and a portion of said first ions are etched away;

implanting second ions into said etched drain region and said exposed portion of said gate electrode;

depositing a third layer of undoped polysilicon over a surface of said interpoly oxide and within said opening to said drain region and patterning said third undoped polysilicon layer wherein said third undoped polysilicon layer forms said resistive load element and wherein during subsequent processing said second ions implanted into said drain region and said exposed portion of said gate electrode diffuse into said third layer of undoped polysilicon and diffuse into said semiconductor substrate underlying said drain region to increase a junction depth of said drain region; and doping said third undoped polysilicon layer to define a resistor value completing said formation of said resistive load element in the fabrication of said integrated circuit.

19. The method according to claim 18 wherein said first doped polysilicon layer has a thickness of between about 1000 to 3000 Angstroms.

20. The method according to claim 18 wherein said first doped polysilicon layer is doped by diffusion of $POCl_3$.

21. The method according to claim 18 wherein said first doped polysilicon layer is doped by ion implant of phosphorus ions with a dosage of between about 3 E 15 to 1 E 16 atoms/$cm^2$.

22. The method according to claim 18 wherein said tungsten silicide layer is deposited to a thickness of between about 1000 to 3000 Angstroms.

23. The method according to claim 18 wherein said second undoped polysilicon layer is deposited to a thickness of between about 400 to 800 Angstroms.

24. The method according to claim 18 wherein said first ions are arsenic ions implanted at a dosage of between about 1 E 15 to 5 E 15 atoms/$cm^2$ and an energy of between about 30 to 80 KeV.

25. The method according to claim 18 wherein said first ions are $BF_2$ ions implanted at a dosage of between about 1 E 15 to 5 E 15 atoms/$cm^2$ and an energy of between about 30 to 60 KeV.

26. The method according to claim 18 wherein said interpoly oxide layer is deposited to a thickness of between about 1200 to 2500 Angstroms.

27. The method according to claim 18 wherein said third undoped polysilicon layer is deposited to a thickness of between about 400 to 1000 Angstroms.

28. The method according to claim 18 wherein said second ions are arsenic ions implanted with a dosage of between about 5 E 15 to 1 E 16 atoms/cm$^2$ and an energy of between about 50 to 80 KeV.

29. The method according to claim 18 wherein said second ions are phosphorus ions implanted with a dosage of between about 5 E 15 to 1 E 16 atoms/cm$^2$ and an energy of between about 50 to 80 KeV.

30. The method according to claim 18 wherein said junction depth of said drain region is between about 1500 to 2500 Angstroms.

31. The method according to claim 18 wherein said third undoped polysilicon layer is doped with phosphorus ions implanted with a dosage of between about 1 E 13 to 3 E 14 atoms/cm$^2$ and an energy of between about 30 to 60 KeV.

32. The method according to claim 18 wherein said third undoped polysilicon layer is doped with boron ions implanted with a dosage of between about 1 E 13 to 3 E 14 atoms/cm$^2$ and an energy of between about 30 to 60 KeV.

33. A method of forming a resistive load element in a fabrication of an integrated circuit comprising:

providing a pattern of gate electrodes and interconnection lines wherein said gate electrodes and interconnection lines comprise a tungsten silicide layer formed between a first doped polysilicon layer and a second undoped polysilicon layer over a semiconductor substrate;

implanting first ions into said semiconductor substrate to form source and drain regions;

depositing an interpoly oxide layer overlying a surface of said semiconductor substrate;

etching away said interpoly oxide where it is not covered by a mask to provide an opening to said drain region within said semiconductor substrate and exposing a portion of one of said gate electrodes wherein a spacer comprising interpoly oxide is left on a sidewall of said exposed portion of one of said gate electrodes within said opening to said drain region;

overetching said interpoly oxide layer to remove said interpoly oxide spacer whereby a top portion of said drain region within said semiconductor substrate and a portion of said first ions are etched away;

implanting second ions into said etched drain region and said exposed portion of one of said gate electrodes;

depositing a third layer of undoped polysilicon over a surface of said interpoly oxide and within said opening to said drain region and patterning said third undoped polysilicon layer wherein said third undoped polysilicon layer forms said resistive load element and wherein during subsequent processing said second ions implanted into said drain region and said exposed portion of one of, said gate electrodes diffuse into said third layer of undoped polysilicon and diffuse into said semiconductor substrate underlying said drain region to increase a junction depth of said drain region; and doping said third undoped polysilicon layer to define a resistor value completing said formation of said resistive load element in the fabrication of said integrated circuit.

34. The method according to claim 33 wherein said first ions are arsenic ions implanted at a dosage of between about 1 E 15 to 5 E 15 atoms/cm$^2$ and an energy of between about 30 to 80 KeV.

35. The method according to claim 33 wherein said first ions are BF$_2$ ions implanted at a dosage of between about 1 E 15 to 5 E 15 atoms/cm$^2$ and an energy of between about 30 to 60 KeV.

36. The method according to claim 33 wherein said interpoly oxide layer is deposited to a thickness of between about 1200 to 2500 Angstroms.

37. The method according to claim 33 wherein said third undoped polysilicon layer is deposited to a thickness of between about 400 to 1000 Angstroms.

38. The method according to claim 33 wherein said second ions are arsenic ions implanted with a dosage of between about 5 E 15 to 1 E 16 atoms/cm$^2$ and an energy of between about 50 to 80 KeV.

39. The method according to claim 33 wherein said second ions are phosphorus ions implanted with a dosage of between about 5 E 15 to 1 E 16 atoms/cm$^2$ and an energy of between about 50 to 80 KeV.

40. The method according to claim 33 wherein said junction depth of said drain region is between about 1500 to 2500 Angstroms.

41. The method according to claim 33 wherein said third undoped polysilicon layer is doped with phosphorus ions implanted with a dosage of between about 1 E 13 to 3 E 14 atoms/cm$^2$ and an energy of between about 30 to 60 KeV.

42. The method according to claim 33 wherein said third undoped polysilicon layer is doped with boron ions implanted with a dosage of between about 1 E 13 to 3 E 14 atoms/cm$^2$ and an energy of between about 30 to 60 KeV.

* * * * *